United States Patent [19]
Williams

[11] 4,355,348
[45] Oct. 19, 1982

[54] AUDIO SIGNAL RESPONSIVE OPTICAL DISPLAY

[76] Inventor: Theodore R. Williams, 1927 Clifton, Royal Oak, Mich. 48073

[21] Appl. No.: 173,633

[22] Filed: Jul. 30, 1980

[51] Int. Cl.³ .............................................. H04M 1/22
[52] U.S. Cl. ..................................... 362/86; 362/231; 362/234; 362/240; 362/252; 362/253; 362/276; 362/367; 362/800; 362/806; 362/811
[58] Field of Search ................. 362/240, 86, 234, 252, 362/253, 231, 276, 367, 806, 800, 811

[56] References Cited

U.S. PATENT DOCUMENTS 3,062,085 11/1962 Smith ...................................... 362/86
4,305,117 12/1981 Evans ..................................... 362/276

Primary Examiner—Stephen J. Lechert, Jr.
Attorney, Agent, or Firm—Barnes, Kisselle, Raisch & Choate

[57] ABSTRACT

Apparatus for providing an optical display as a function of frequency and amplitude of an audio music signal comprising a plurality of frequency selection circuits and a corresponding plurality of linear optical displays for providing a composite bar display comprising a plurality of linear bar segments each having a length which varies as a function of amplitude of a corresponding frequency component of the input music signal. The display is preferably in the form of a row and column array of individual optical display elements such as LED's. The apparatus also includes bar/dot display drivers and an operator-responsive switch for alternately selecting either a bar or a dot display at the LED array.

7 Claims, 3 Drawing Figures

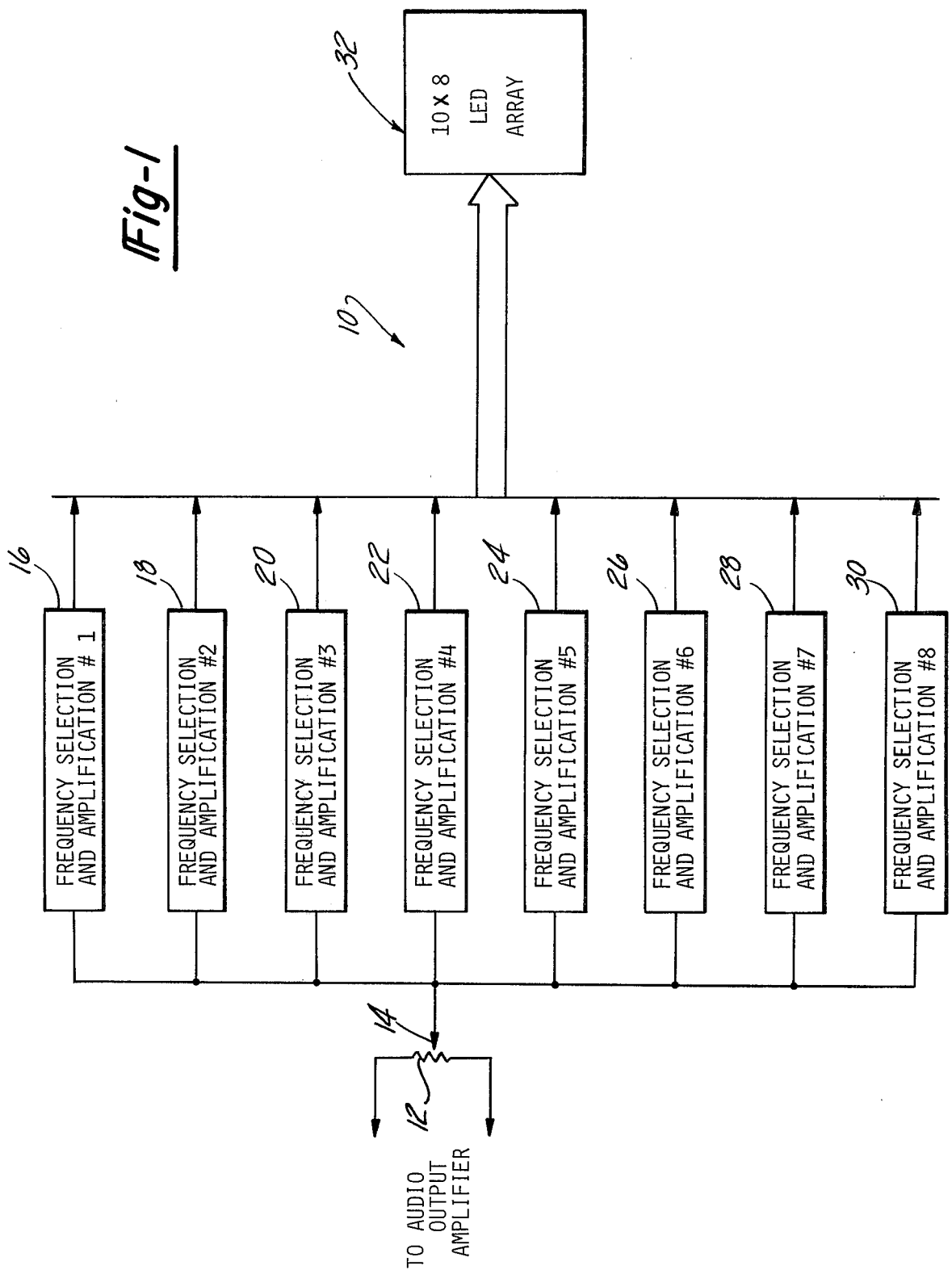

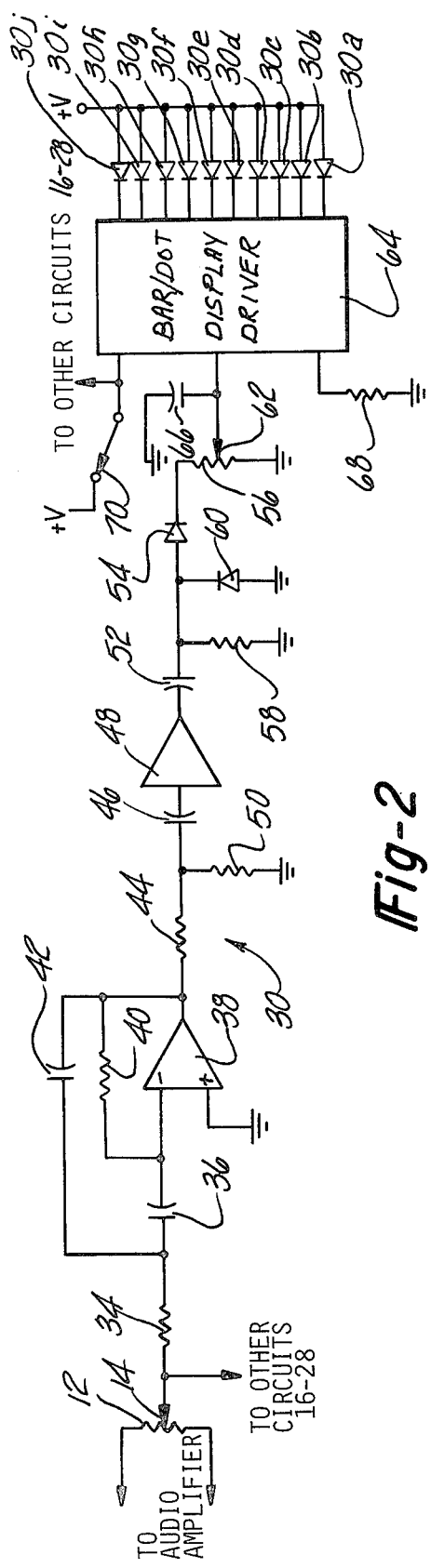
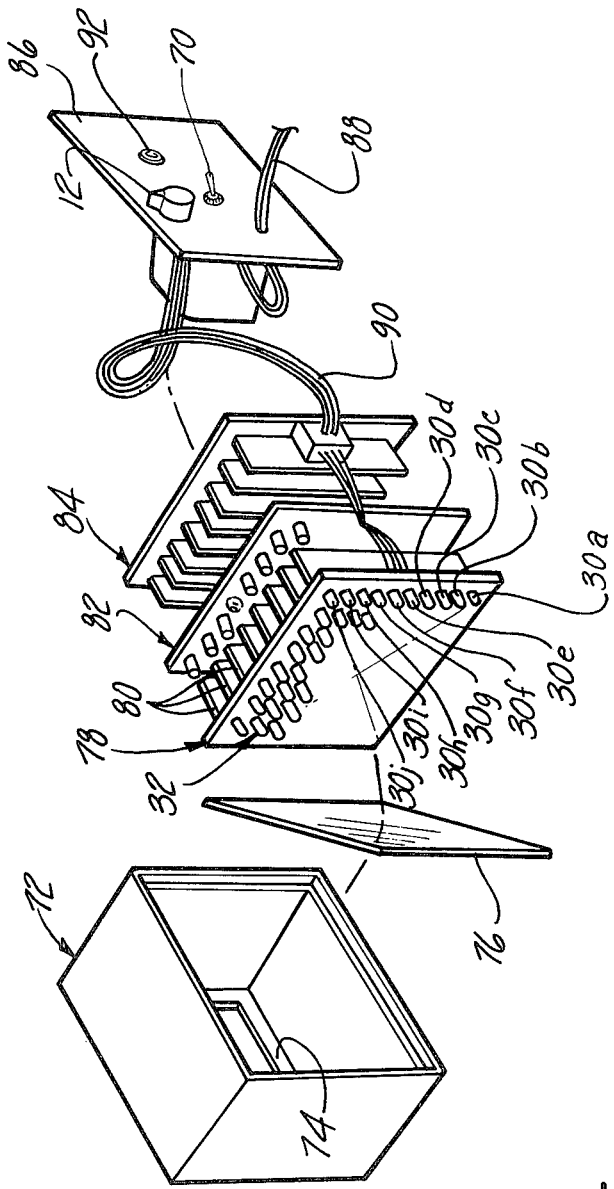

AUDIO SIGNAL RESPONSIVE OPTICAL DISPLAY

The present invention relates to audio accessories, and more particularly to optical display apparatus responsive to amplitude and/or frequency of audio music signals.

An object of the present invention is to provide a pleasant and entertaining accessory to an audio system, such as a stereo or high-fi system, which provides a varying optical light display related to variations in the music signals. A more specific object of the invention is to provide an apparatus of the type described which is adapted to provide a plurality of differing displays selectable by an operator.

The invention, together with additional objects, features and advantages thereof, will be best understood from the following description, the appended claims and the accompanying drawings in which:

FIG. 1 is a functional block diagram of a presently preferred embodiment of the apparatus in accordance with the invention;

FIG. 2 is a schematic diagram of a portion of the apparatus as illustrated in FIG. 1; and FIG. 3 is an exploded perspective view of the apparatus illustrated functionally and schematically in FIGS. 1 and 2.

Referring to FIG. 1, a presently preferred embodiment 10 of the apparatus in accordance with the invention comprises an adjustable input resistor 12 adapted for connection across the output leads of an audio amplifier or the like. The wiper 14 of resistor 12 is connected to a plurality, preferably eight, frequency selection and amplification circuits 16-30. Circuits 16-30 effectively separate the audio music signal appearing at wiper 14 into a plurality of frequency bands or components, and provide at their outputs signals which vary as a function of the amplitude of the respective corresponding frequency bands or components. The outputs of circuits 16-30 are connected to a plurality of LED's configured in a ten row by eight column planar rectilinear array 32 (FIGS. 1 and 3). Array 32 thus provides a composite display comprising a plurality of eight linear segments each having ten display elements. Each frequency selection and amplification circuit 16-30 is connected to a corresponding linear segment or column of array 32 so as to provide at the corresponding column an optical display which varies as a function of amplitude of the particular frequency component.

Frequency selection and amplification circuit 30 is illustrated in schematic detail in FIG. 2. Wiper 14 is connected through a resistor 34 and then through a capacitor 36 to the inverting input of an operational amplifier 38 which has its non-inverting input connected to ground. The output of amplifier 38 is connected to the inverting amplifier input through a resistor 40, and to the junction of resistor 34 and capacitor 36 through the capacitor 42. The output of amplifier 38 is also connected through a resistor 44 and then through a coupling capacitor 46 to the input of an audio amplifier 48. A resistor 50 is connected from the junction of resistor 44 and capacitor 46 to ground. The output of amplifier 48 is connected through a second coupling capacitor 52 and through the anode-cathode junction of a diode 54 to one terminal of an adjustable resistor 56. A resistor 58 is connected from the junction of resistor 52 and diode 54 to ground. A second diode 60 has its cathode connected to the anode of diode 54 and its anode connected to ground.

The wiper 62 of resistor 56 is connected to the signal input of a bar/dot display driver 64, such as an LM3914 driver marketed by National Semiconductor. A filter capacitor 66 is connected from the signal input of driver 64 to ground. A resistor 68 is connected between an intensity control input of driver 64 and ground. A bar/dot select input of driver 64 is connected to the common contact of an operator-responsive bar/dot mode select switch 70 which has a normally closed contact connected to a positive voltage source. Driver 64 has a plurality of outputs which are sequentially or collectively energized depending upon the condition of mode select switch 70 in proportion to the d.c. input signal from resistor 56. These outputs are individually connected to the cathodes of the LED's 30a through 30j which collectively comprise the one linear segment or column of array 32 (as best seen in FIG. 3) associated with frequency selection and amplification circuit 30. The anodes of the several LED's 30a through 30j are connected to the positive voltage source. It will also be appreciated that amplifiers 38, 48 and driver 64 are connected to a suitable voltage source and to ground.

In operation of frequency selection and amplification circuit 30, resistors 34, 40, capacitors 36, 42 and amplifier 38 collectively comprise an RC active filter having a gain, a nominal or center frequency and a bandwidth determined by the values of the various resistive and capacitive components. The frequency component or bandwidth selected by the filter is amplified at 48 and then rectified by diodes 54, 60 so as to provide across capacitor 66 a d.c. signal which varies as a function of amplitude of the selected frequency component. Driver 64 energizes LED's 30a-30j as a function of such d.c. signal. In a bar display mode of operation with switch 70 in the closed position illustrated in FIG. 2, the number of LED's energized is proportional to the amplitude of the input d.c. voltage, with LED 30a being the least significant. In the bar display mode of operation, LED's 30a-30j thus provide one segment of a bar chart collectively responsive to frequency and amplitude of the input music signal. In a dot mode of operation with switch 70 open, only one of the LED's 30a-30j is energized, with the energized LED being selected as a sequential function of input signal amplitude, and with LED 30a again being the least significant.

Frequency selection and amplification circuits 16-28 are identical to circuit 30 illustrated in detail in FIG. 2 and are connected to the remaining columns of array 32 as previously described. The bar/dot selection input of each display driver in circuits 16-28 is connected to the common contact of switch 70 as shown in FIG. 2, and the input to each circuit is connected to the wiper of resistor 12 as shown in FIGS. 1 and 2. Input resistor 12 thus provides for adjustment of the amplitude of the input signal to all circuits 16-30. The values of resistors 34, 40 and capacitors 36, 42 vary in each circuit 16-30 for effectively selecting a different frequency band or component of the input audio signal. The resistor 56 in each circuit is factory adjusted so as to normalize the corresponding bar/dot display driver to the maximum expected amplitude of the corresponding frequency component.

Mechanical details of one working embodiment of the invention are illustrated in FIG. 3 as comprising a generally rectangular enclosure 72 having an open front 74. A window 76 of smoked glass or tinted translucent plastic is received within enclosure 72 adjacent front 74 so as to provide a display window. A display circuit board assembly 78 is fitted within enclosure 72 behind window 76. LED array 32 is disposed on one face of board 78 with the individual LED's projecting forwardly. A plurality of eight daughter boards 80 are carried on the opposing face of board 78. Each daughter board 80 includes resistors 56, 58 diodes 54, 60, capacitor 66 and driver 64 of the corresponding frequency selection and amplification circuit 16-30. Disposed behind display board 78 is a filter circuit board assembly 82 which includes the resistors 34, 40, 44 and 50, the capacitors 36, 42, 46 and 52, and the amplifiers 38, 48 for all circuits 16-30. A power supply circuit board assembly 84 is disposed within enclosure 72 behind filter board 82. A removable rear wall 86 of enclosure 72 carries operator-responsive bar/dot select switch 70, input resistor 12 having a suitable knob mounted thereto, a power cord 88 for connection to a suitable source of utility power and a jack 92 for receiving the audio input signal. Rear wall 86 and boards 78, 82, 84 are interconnected by a cable 90. The various circuit boards are separated from each other in assembly by suitable stand-offs (not shown).

From the foregoing description, it will be appreciated that there has been provided in accordance with the invention an aesthetically pleasing and fascinating optical display apparatus which is uniquely responsive to frequency and amplitude of input audio music signals and the like. The apparatus is adapted alternately to provide either a composite bar chart comprising a plurality of linear bar segments individually responsive to input frequency and amplitude, or a display of "floating dots" in which the various "dots" undulate as a function of audio frequency and amplitude. Preferably, the bar segments are disposed in a vertical orientation and the dots undulate vertically as in the embodiment described, although the invention also contemplates horizontal orientation where the latter is desired. Similarly, although an LED array is preferred for brightness and lower power consumption, other types of optical displays, such as LED's fluoresent and incandescent displays, are contemplated. The number of frequency selection circuits and the frequencies selected by each circuit may vary as desired.

I claim:

1. Apparatus for providing an optical display as a function of frequency and amplitude of audio music signals and the like comprising input means for connection to an audio signal source, frequency selection means connected to said input means for separating an audio signal into a plurality of frequency components and an optical display comprising a plurality of laterally adjacent parallel linear optical display segments individually connected to said frequency selection means, such that said optical display comprises a composite display with said plurality of linear display segments each having a display characteristic which varies as a function of amplitude of a corresponding said frequency component of said audio signal.

2. The apparatus set forth in claim 1 wherein said plurality of linear display segments comprise a rectilinear row and column array of individual optical display elements connected to said frequency selection means such that each said segment comprises a corresponding column of said array, said array and frequency selection means including means for individually energizing each of said elements.

3. The apparatus set forth in claim 2 wherein said means for individually energizing each of said elements comprises bar/dot display driver means and means coupled to said driver means for alternately selecting a first mode of operation wherein said display segments provide a composite bar chart display with each bar having a length which varies as a function of amplitude of said corresponding frequency component, and a second mode of operation wherein only one of said elements in each said segment is energized with said one element being selected as a function of amplitude of a said corresponding frequency component.

4. The apparatus set forth in claim 3 wherein means for selecting said modes of operation comprises operator responsive switch means.

5. The apparatus set forth in claim 4 wherein said frequency selection means comprises a plurality of individual frequency selection circuits, and wherein said input means includes means for collectively adjusting input amplitude of said audio signal fed to said frequency selection circuits.

6. The apparatus set forth in claim 5 further comprising a generally rectangular enclosure having a translucent front wall, said elements being disposed in said row and column array within said enclosure and being visible through said translucent front wall, and wherein said operator responsive switch means and said means for adjusting amplitude of said audio signal are disposed on a rear wall of said enclosure remote from said front wall.

7. The apparatus set forth in claim 2, 3 or 5 wherein said frequency selection means includes means for individually adjusting amplitude of each said corresponding frequency component.

* * * * *